US007349514B2

(12) United States Patent
Meltzer et al.

(10) Patent No.: US 7,349,514 B2
(45) Date of Patent: Mar. 25, 2008

(54) FREQUENCY/PHASE LOCKED LOOP CLOCK SYNTHESIZER USING AN ALL DIGITAL FREQUENCY DETECTOR AND AN ANALOG PHASE DETECTOR

(75) Inventors: David Meltzer, Wappingers Falls, NY (US); Gregory Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 794 days.

(21) Appl. No.: 10/796,331

(22) Filed: Mar. 8, 2004

(65) Prior Publication Data

US 2004/0223575 A1 Nov. 11, 2004

Related U.S. Application Data

(60) Provisional application No. 60/459,854, filed on Apr. 1, 2003.

(51) Int. Cl.
*H03D 3/24* (2006.01)
(52) U.S. Cl. ...................................................... 375/376
(58) Field of Classification Search ................. 375/376; 331/11
See application file for complete search history.

(56) References Cited

U.S. PATENT DOCUMENTS

| 5,446,416 | A | * | 8/1995 | Lin et al. ........................ 331/11 |
| 6,028,460 | A | * | 2/2000 | McCollum et al. ........... 327/105 |
| 6,114,920 | A | * | 9/2000 | Moon et al. .................. 331/179 |
| 6,310,521 | B1 | * | 10/2001 | Dalmia .......................... 331/11 |
| 6,826,246 | B1 | * | 11/2004 | Brown et al. ................. 375/376 |
| 2001/0007436 | A1 | * | 7/2001 | Dosho et al. ................... 331/11 |

OTHER PUBLICATIONS

Messerschmitt, "Frequency Detectors for PLL Acquisition in Timing and Carrier Recovery", IEEE Transactions on Communications, Publication Date: Sep. 1979, vol. 27, Issue: 9 pp. 1288-1295.*
F.M. Gardner, "Properties of Frequency Difference Detectors" IEEE Transactions on Communications vol. COM-33, No. 2, Feb. 1985, pp. 131-138.
B. Razavi, "Design of Monolithic Phase-Locked Loops and Clock Recovery Circuits—A Tutorial" in Monolithic Phase-Locked Loops and Clock Recovery Circuits, Edited by Behzad Razavi, New York, IEEE Press, 1996.

(Continued)

*Primary Examiner*—Mohammed Ghayour
*Assistant Examiner*—Juan Alberto Torres
(74) *Attorney, Agent, or Firm*—Rosalio Haro

(57) ABSTRACT

A frequency synthesizer, for integration in a low voltage digital CMOS process, controls a VCO using a dual loop structure including an analog loop and a digital loop. The digital loop includes an all digital frequency detector, which controls a center frequency of the VCO. The analog loop includes an analog phase detector and charge pump, which add phase coherence to the frequency controlled loop. The analog loop reduces the noise of the digital logic and VCO, and the digital control provides frequency holdover and very low bandwidth. The bandwidth of the digital loop is made smaller than the bandwidth of analog loop, and is preferably 200 times smaller. This parametric difference allows two separate control inputs to the VCO, one from the analog loop and one from the digital loop, with both inputs functioning relatively independently of each other.

22 Claims, 5 Drawing Sheets

OTHER PUBLICATIONS

I. Hwang, S. Song, S. Kim, "A Digitally Controlled Phase-Locked Loop With a Digital Phase-Frequency Detector for Fast Acquisition", IEEE Journal of Solid-State Circuits, vol. 36, No. 10, Oct. 2001, pp. 1574-1581.

A. Hajimiri and T.H. Lee, "Design Issues in CMOS Differential LC Oscillators", IEEE Journal Of Solid-State Circuits, vol. 34, No. 5, May 1999, pp. 717-724.

* cited by examiner

FREQUENCY/PHASE LOCKED LOOP CLOCK SYNTHESIZER USING AN ALL DIGITAL FREQUENCY DETECTOR AND AN ANALOG PHASE DETECTOR

RELATED APPLICATIONS

This application claims priority under 35 U.S.C. § 119(e) from application Ser. No. 60/459,854, filed Apr. 1, 2003.

BACKGROUND OF THE INVENTION

1. Field of the Invention

The present invention relates generally to the field of integrated frequency synthesizers and oscillators. Specifically, the present invention relates to the field of variable voltage oscillators implemented using low voltage digital CMOS processes.

2. Description of the Related Art

High speed Phase Locked Loops are used in modern communication systems for many purposes, including frequency synthesizing operations such as clock generation, data recovery, and retiming. Such frequency synthesizers are typically analog circuits, but to lower cost a trend in industry is to implement such circuits using low voltage digital CMOS processes.

Frequency synthesizers are typically voltage controlled, and thus suffer from signal headroom and scalability problems when implemented in low voltage digital CMOS processes. In spite of these problems, use of advanced submicron digital CMOS processes to implement analog clock generation and recovery continues to increase due to its benefit of significantly lower operating voltages.

As operating voltages are reduced, however, the amount of voltage range, or voltage headroom, available for these analog circuits is significantly reduced. As a result, the voltage range available for a frequency control and correction signal is greatly reduced requiring that the oscillator function within more rigid design parameters. Thus, this decreased headroom for analog circuits imposes a significant constraint on circuit design in high frequency clock synthesis.

Although, the corollary to this trend is the availability of complex digital functions in minimal area, it is well known that the integration of complex high speed digital functions in close proximity to low headroom, high gain analog clock components gives rise to spurious frequencies and higher jitter components.

Thus, a need exists for a method of implementing analog circuits within a low voltage digital CMOS process with reduced jitter and expanded voltage headroom.

OBJECTS OF THE INVENTION

The present invention is directed to solving these problems.

One object of the present invention is to provide an voltage controlled oscillator, VCO, suitable for integration in a low voltage digital CMOS process, in which the VCO's voltage headroom is not much reduced from its rail-to-rail voltage range.

Another object of the present invention is to provide an analog VCO in a low voltage digital CMOS process with reduced jitter and greater frequency locking range.

It is still another object of the present invention to provide a simple method for implementing an analog VCO in a digital CMOS process without requiring modification of the CMOS process.

SUMMARY OF THE INVENTION

To achieve these objects, the present invention implements a frequency synthesizer having a dual loop structure including an analog loop and a digital loop to control a voltage controlled oscillator, VCO. The digital loop includes an all digital frequency difference detector (FDD), which controls the center frequency of the VCO. The analog loop includes an analog phase frequency detector (PFD) and charge pump, which adds phase coherence to the frequency controlled loop, thus eliminating any static frequency error. In effect, the analog loop reduces the noise of the digital logic and VCO, and the digital control provides frequency holdover and very low bandwidth. The bandwidth of the digital loop is made much smaller than the bandwidth of analog loop. Preferably, the bandwidth of the analog loop is at least 200 times greater than the bandwidth of the digital loop. This gross parametric difference is used in the design of the VCO to allow two separate control inputs, a first analog control input provided by the PFD within the analog loop and a second digital control signal provided by the FDD within the digital loop. Both control inputs function relatively independently of each other.

In a first embodiment of the present invention, the VCO is provided with two frequency adjusting mechanisms separately responsive to the first control input from the PFD and to the second control input from the FDD, respectively. The first frequency adjusting mechanism includes a varactor pair responsive to the first, analog control input from the PFD. The second frequency adjusting mechanism includes an array of capacitor/switch pairs, wherein the switches are each responsive to separate bit lines of digital signal bus conveying the second, digital control signal from the FDD. The switches conditionally couple and decouple their corresponding capacitor to and from said VCO circuit in accordance with the second control input.

The digital frequency difference detector includes an n-bit counter to count cycles of a reference frequency and an m-bit counter to count cycles of the oscillating output signal from the VCO, where m is greater than n. Both counters are reset, stopped, and started together in accordance with a control logic circuit.

Two memory cells, preferably implemented as latches, monitor the nth and (n+1)th bit within the m-bit counter and record when either of the nth or (n+1)th bit transition to a logic high. Both latches retain their recorded condition until they are reset by the control logic circuit irrespective of whether the nth or (n+1)th bit within the m-bit counter later transition back to a logic low while in the process of counting the cycles of VCO's output. Both counters are automatically stopped in response to the nth bit within the n-bit counter transitioning to a logic high. At this point, the current data contents of the m-bit counter, as well as the stored contents of the two memory cells are studied. A predetermined number of least significant bits (LSB's) within the m-bit counter are ignored to disregard any difference in the count of the n-bit counter and the m-bit counter due to relative phase differences between the VCO's output signal and the reference frequency signal. From the data content of the m-bit counter (excluding the predetermined number of LSB's) and the set conditions of the two memory cells, the control logic circuit determines if the VCO's output frequency is faster than, slower than, or locked to the reference frequency signal, and sends an appropriate second control signal to the VCO to compensate as required.

The architecture of the FDD provides an inherent low pass filtering operation for filtering the frequency difference between the reference frequency signal and the VCO's output signal. The bandwidth of the FDD's inherent low pass filter is adjustable by increasing or decreasing the value of n in said n-bit counter and adjusting the increment/decrement digital step size of the second control signal sent to the VCO.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Preferred embodiments of the present invention are described below with reference to the accompanying figures.

Figure 1:
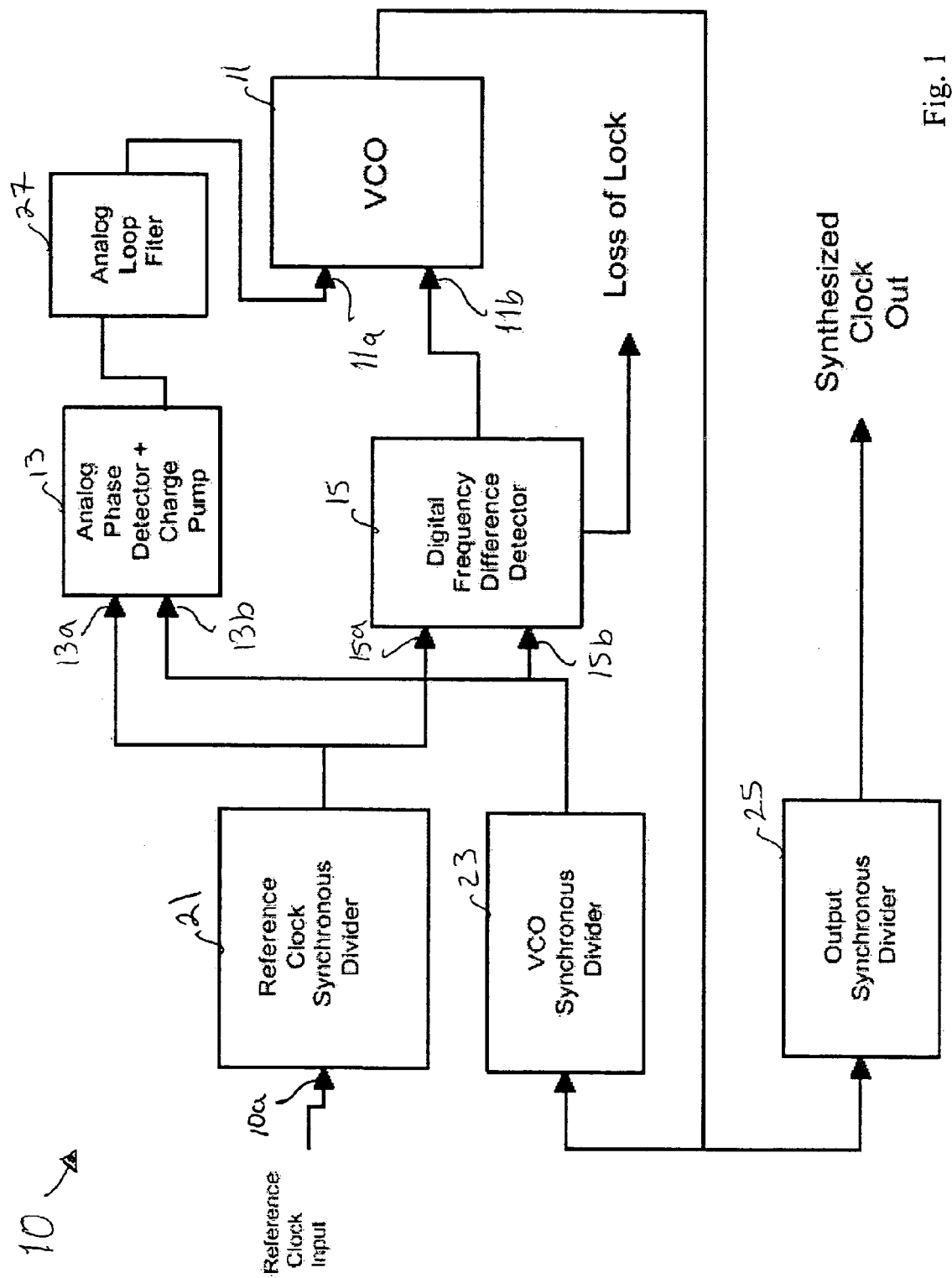
FIG. 1 is a block diagram of a frequency synthesizer in accord with a first embodiment of the present invention.

With reference to FIG. 1, a frequency synthesizer 10, or clock synthesizer, in accord with the present invention includes a variable oscillator 11, preferably a voltage controlled oscillator (VCO), having a first control input 11a and second control input 11b. VCO 11 produces an oscillator output signal whose frequency is dependent on both its first 11a and second 11b control inputs.

Frequency synthesizer 10 also includes an analog phase detector 13 and a digital frequency difference detector (FDD) 15. Preferably, analog phase detector 13, which is sometimes referred to as phase frequency detector, PFD, includes a charge pump, not separately shown. Analog phase detector 13 has first 13a and second 13b phase-detection inputs and is effective for producing a first control signal representative of the phase difference of signals applied to its first 13a and second 13b phase-detection inputs. Digital frequency difference detector 15 has first 15a and second 15b frequency-detection inputs, and is effective for producing second control signal representative of the frequency difference of signals applied to its first 15a and second 15b frequency-detection inputs. The first and second control signals from analog phase detector 13 and digital frequency difference detector 15 are coupled to the first 11a and second 11b control inputs of VCO 11, respectively. Preferably, the first control signal of analog phase detector 13 is couple to the first control input 11a of VCO 11 via an analog loop filter 27.

It is to be understood that the first control signal output from analog phase detector, or analog phase/frequency detector, 13 is an analog signal, and it may represent a varying phase difference by a proportionally varying signal intensity. It is also to be understood that the second control signal output from digital frequency difference detector 15 is a digital signal, which outputs onto a single conductive line or onto a signal bus, and has a digital value indicative of a frequency difference.

An input node 10a of frequency synthesizer 10 receives a reference frequency signal, which in the present case is embodied by a reference clock input signal. If desired, the reference clock input signal may be applied directly to first phase-detection input 13a and first frequency-detection input 15a, but it is preferred that the frequency of the reference clock input signal first be stepped down by passing it through a first frequency divider 21. The output of this Reference Clock Synchronous Divider 21 is applied to analog phase detector 13 and digital frequency difference detector 15. It is to be understood that use of a frequency divider is a design choice for reducing design complexity, and not critical to the invention.

In a similar manner, the oscillator output signal from VCO 11 may be fed back directly to second phase-detection input 13b and second frequency-detection input 15b, but it is preferred that its frequency also first be stepped down by passing it through a second frequency divider, i.e. VCO Synchronous divider 23. In the present case the oscillator output signal is passed through another frequency divider, Output Synchronous Divider 25, to produce the Synchronized Clock Output signal of frequency synthesizer 10.

In this manner, frequency synthesizer 10 incorporates a conventional analog Phase Lock Loop (PLL) structure consisting of the path from analog phase detector 13 to VCO 11 and back to analog phase detector 13. The present invention further adds a second, digital loop to the conventional PLL structure. The digital loop is defined by the path from digital frequency difference detector to VCO 11 and back to frequency difference detector 15. Preferably, the bandwidth of the digital loop is made much smaller than the bandwidth of analog loop. In the present embodiment, the bandwidth of the analog loop is at least 200 times greater than the bandwidth of the digital loop. This gross parametric difference is used in the design of VCO 11 to allow two separate control inputs, one from the analog loop and one from the digital loop.

Thus, the present invention implements a dual loop controlled frequency synthesizer, with one loop being a digital loop and the other being an analog loop. In the present first embodiment, the digital loop includes the all digital frequency detector 15, which controls the center frequency of VCO 11 and thereby reduces the voltage swing needed for the first control signal from the analog loop and increases the pulling range of the VCO. The analog loop, which includes low gain, analog phase detector/charge pump 13, adds phase coherence to the frequency controlled loop, thus eliminating any static frequency error. In effect, the analog loop reduces the noise of the digital logic and VCO 11. The digital control provides frequency holdover and very low bandwidth.

Figure 2:
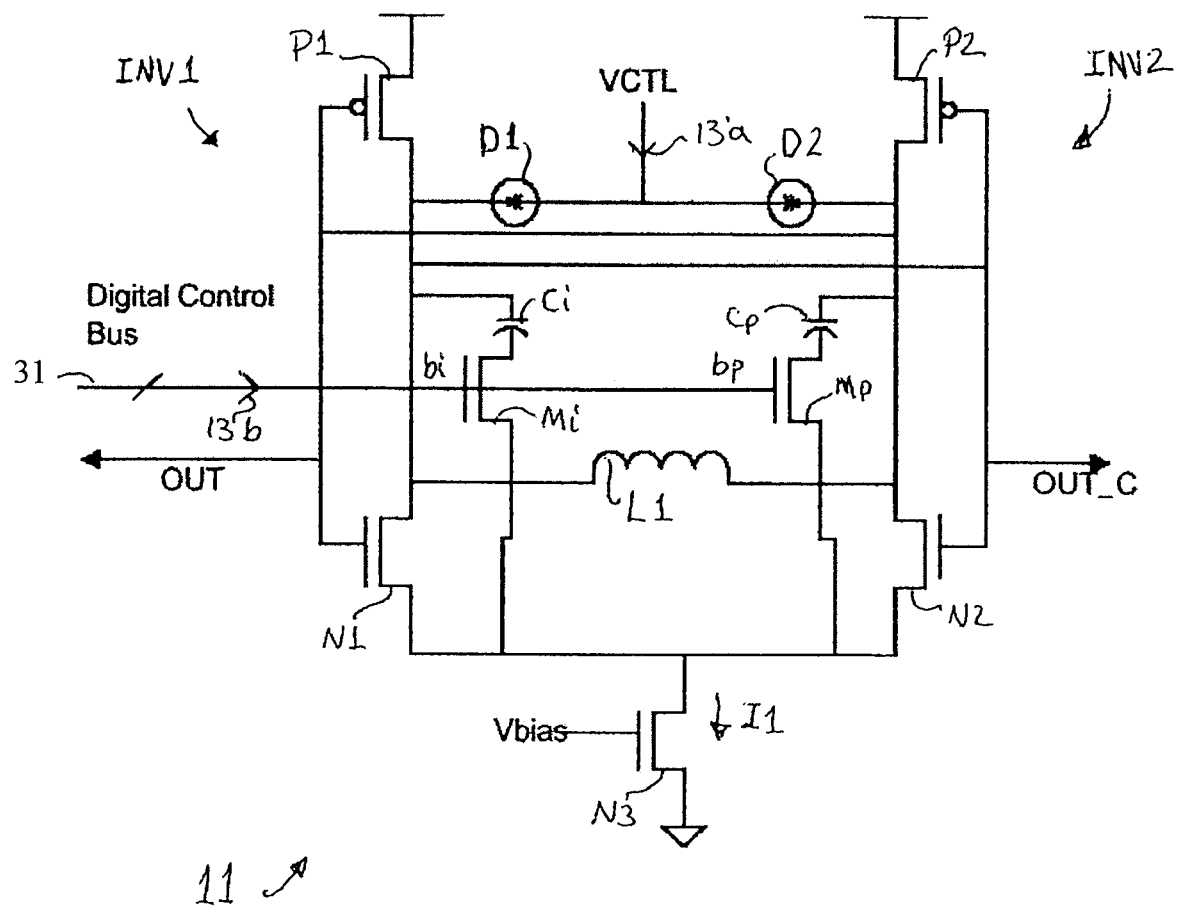
FIG. 2 is a first implementation of a voltage controlled oscillator with the present invention.

As specified above, the second control signal, which is output from digital frequency difference detector, FDD, 15 may be placed onto a signal bus that provides digital control for VCO 11. With reference to FIG. 2, a sample implementation of VCO 11 suitable for receiving a digital control bus 31 from FDD 15 as its second control input 11b is shown.

The present embodiment uses a current limited, cross-coupled inverter pair, LC, CMOS oscillator with its frequency controlled by first control input 13a, carrying analog signal VCTL from analog phase detector 13, and by second control input 13b carrying the digital control bus signal from FDD 15. First inverter INV1 (consisting of PMOS transistor P1 and NMOS transistor N1) is cross-coupled with second inverter INV2 (consisting of PMOS transistor P2 and NMOS transistor N2). The current through inverters INV1 and INV is limited by a current source, i.e. a current tail I1, consisting of NMOS transistor N3 and set by a bias signal Vbias. An inductor L1 is coupled across the outputs of INV1 and INV2. The frequency of VCO 11 is adjusted by adjusting two separate capacitive parameters.

The first capacitive parameter is embodied by a varactor diode pair, D1 and D2, which vary their capacitive value in accordance with control voltage VCTL. The varactor diode pair D1/D2 is coupled in parallel to inductor L1 to form an LC tank.

The second capacitive parameter is embodied by an array of capacitors Ci to Cp switched in and out of the oscillator circuit by corresponding transistors Mi to Mp according to the value contained on a corresponding bit line bi to bp of the digital control bus 31. Thus, the digital control signal from FDD 15 selectively couples and decouples specific capacitors of array Ci-Cp to and from the oscillator circuit. In the present embodiment, the array of capacitors Ci-Cp is returned to the drain of the tail current transistor N3, i.e. capacitors Ci to Cp are selectively coupled from the outputs of INV1 and INV2 to the source electrode of transistor N3. Alternatively, the array of transistor/capacitors pairs Mi/Ci to Mp/Cp could also be returned to ground. This would increase the tuning range, but might increase noise in the oscillator.

FDD 15 of FIG. 1 may be implemented in different ways. For example, FDD 15 could be of the type that directly determines the frequency of the reference clock and generates a digital control value needed to set the array of capacitors and control switches Mi/Ci to Mp/Cp. However, this requires the equivalent of a set of coefficients correlating each digital value to a frequency of oscillation of VCO 11, which are very dependent on manufacturing process, voltage, and temperature variations. The presently preferred FDD embodiment therefore takes a different approach, and generates only a frequency difference indicator, to increment or decrement the capacitance value of the array of capacitors Ci to Cp.

Figure 3:
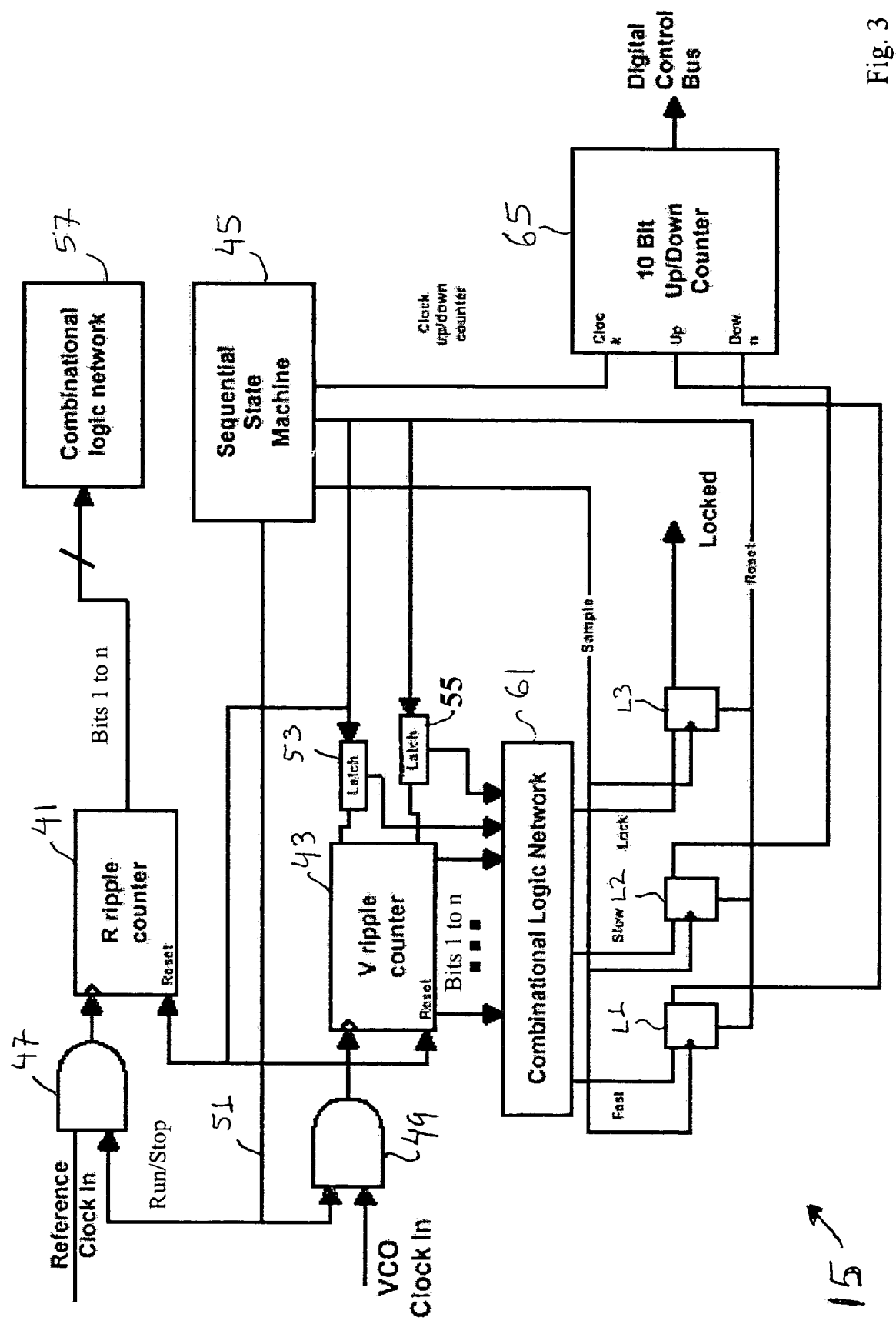
FIG. 3 is a block diagram of a digital frequency detector in accord with the present invention.

With reference to FIG. 3, a block structure of digital frequency difference detector, FDD 15, in accord with the present invention preferably includes two binary ripple counters 41 and 43, both having reset inputs controlled by a sequential state machine 45, which is part of a control logic circuit for coordinating the operation of the various logic blocks making up FDD 15. Ripple counters 41 and 43 increment on one edge (either the rising or falling logic edge) of signals applied to their respective inputs. The reference frequency signal applied at input 10a of FIG. 1 (or a stepped down representation of it supplied from frequency divider 21) is coupled to the Reference Clock Input of first AND gate 47. First AND gate 47 functions as a masking gate to selectively allow the reference frequency signal applied to its Reference Clock Input to pass through and be applied to the input of ripple counter 41 as determined by RUN/STOP control signal 51 from sequential state machine 45, or to selectively halt the reference frequency signal and prevent the incrementing of ripple counter 41. Similarly, the oscillator output signal from VCO 11 (or a stepped down representation of it supplied from frequency divider 23) is coupled to a VCO Clock input of a second AND gate 49, which functions as a second masking gate to selectively allow the oscillator output signal to pass through and be applied to the input of ripple counter 43 as determined by RUN/STOP control signal 51, or to selectively halt the oscillator output signal and prevent the incrementing of ripple counter 43.

In this manner, ripple counters 41 and 43 respectively count cycles of the reference frequency signal (at the Reference Clock Input node) and the oscillator output signal (at the VCO Clock input node). Counter 41 is a binary counter of n bits, and counter 43 is binary counter of m bits, where m is greater than, or equal to, n+1. Two one-bit latches, 53 and 55, functions as memory cells to monitor the nth and (n+1)th bits among the m bits of counter 43, and to remember any overflows of the reference count through bit n and n+1. Latches 53 and 55 record when the nth bit and/or the (n+1)th bit of counter 43 transition from a logic low 0 to a logic 1 (assuming that counter 43 is an up-counter).

Preferably, each rising edge of a signal at the Reference Clock Input causes counter 41 to increment its count, and each rising edge of a signal at the VCO Clock input causes the counter 43 to increment its count. Whenever the nth bit of counter 43 is set, i.e. transitions to a logic high, due to an increment-count operation, latch 53 is set and remains set until it is cleared by sequential state machine 45, irrespective of whether the nth bit later transition back to a logic low due to continued counting by counter 43. Whenever the (n+1)th bit of counter 43 is set, i.e. transitions to a logic high, due to an increment-count operation, latch 55 is set and remains set until it is cleared by sequential state machine 45.

The count value of counter 41 is monitored by a combinational logic network 57, which conveys the information to sequential state machine 45. Specifically, combinational logic network 57 monitors the nth and (n−1)th bits of counter 41. When the nth bit of counter 41 is set (i.e. transitions to a logic high) and its n−1 bit is reset (i.e. transitions back, to a logic low), indicating an overflow out of bit n−1 into bit n, sequential state machine 45 issues the RUN/STOP signal to masking gates 47 and 49 to stop the increment-count operations of both counters 41 and 43. This freezes the count contents of both counters 41 and 43.

When counter 41 is stopped, its count contents and the set conditions of latches 53 and 55 are examined and used to determine the relative frequency of the reference frequency signal and oscillator output signal, as observed at the Reference Clock Input and VCO Clock Input, respectively. In the present example, this determination is made by a second combinational logic network 61. It is to be understood that sequential state machine 45, first combinational logic circuit 57 and second combinational logic circuit 61 may be integral parts of a general control logic circuit of FDD 15. If combinational logic network 61 determines that the frequency of the oscillator output signal is higher than the frequency of the reference frequency signal, then it will transmit signal FAST to a first latch L1. If combinational logic network 61 determines that the frequency of the oscillator output signal is lower than that of the reference frequency signal, then it will transmit signal SLOW to second latch L2. If combinational logic network 61 determines that the frequency of the oscillator output is locked to that of the reference frequency signal, then it transmit signal LOCK to third latch L3. Latches L1, L2 and L3 latch in the transmitted signal from combinational logic network 61 in response to command signal SAMPLE issued from sequential state machine 45.

The frequency of the oscillator output signal from VCO 11 is determined to be less than the reference frequency signal if both latches 53 and 55 are not set. Latch 55 must also be off to ensure that more than one complete cycle of counter 43 has not occurred.

The frequency of the oscillator output signal from VCO 11 is determined to be greater than the frequency of the reference frequency signal if more count operations took place in counter 43 than in counter 41. This is the case if either of two conditions are met. The frequency of the oscillator output signal is greater than that of the reference frequency signal if both latches 53 and 55 are set, indicating an overflow out of bit n of counter 43, or if latch 55 is set and there are any logic high bits in stages 2 through n of counter 43. The least significant bit (LSB) (i.e. stage 1) is not checked because there can be a 1 bit difference in the count due to relative phase differences between the oscillator output signal and the reference frequency signal. In the present case, only stage 1, i.e. the lowest value bit, is ignored to account for this possible phase difference. But other number of least significant bits (i.e. such as stages 1 and 2) may be ignored to account for this possible phase difference.

Alternatively, if latch 53 is set and latch 55 is not set, and if there are no logic highs set in any of the bits below the nth bit of counter 43 (excluding the LSB bits that are ignored due to possible phase difference), then the oscillator clock signal and the reference frequency signal are determined to be locked.

After this determination is made, the counters 41 and 43 can be reset and a new measurement cycle can begin. The measurement of the relative frequency of the oscillator output signal and the reference frequency signal stored in latches L1, L2, and L3 indicating either fast, slow or locked are conveyed to an up/down counter 65. Sequential state machine 45 then generates a clock signal for up/down counter 65 to respond to the latched conditions.

In the present embodiment, each bit of counter 65 controls a corresponding one of switch transistors Mi to Mp of FIG. 2. The measurement is used to increment or decrement up/down counter 65 to correct the center frequency of VCO 11. The direction of change for up/down counter 65 is dependent on the pulling curve slope of VCO 11. For the exemplary oscillator structure of FIG. 2, which has a negative slope, the counter is decremented if the measurement indicates that the frequency of the oscillator output signal of VCO 11 is slower than that of the reference frequency signal.

The above description shows that a measurement is taken every $2^{}(n-1)$ periods of the Reference Clock Input. This is an inherent low pass filtering operation of the frequency difference value. The actual time constant of the response of this filter is dependent on the Reference Clock Input, i.e. the reference frequency signal [which determines the measurement interval], the frequency difference and the number of bits in up/down counter 65**. The filter bandwidth can be adjusted by increasing or decreasing the number of bits in the counter and the increment/decrement step size of the up/down counter.

The accuracy of the frequency difference measurement can be adjusted by changing the number of bits in counters 41 and 43, but in general it is unnecessary to have many more bits than there are bits in up/down counter 65, i.e. capacitance steps in the oscillator. Changing the number of bits in counters 41 and 43 also changes the measurement interval. There is an inverse relationship between accuracy and filtering bandwidth. Increasing the measurement interval also increases the acquisition time of the loop. Since the measurement interval is determined by the transitions of the Reference Clock Input, loss of the Reference Clock Input can provide an automatic holdover for VCO 11. In the dual loop system of FIG. 1, a signal must be generated indicating loss of reference to turn off the analog charge pump if the holdover is desired.

Figure 4:
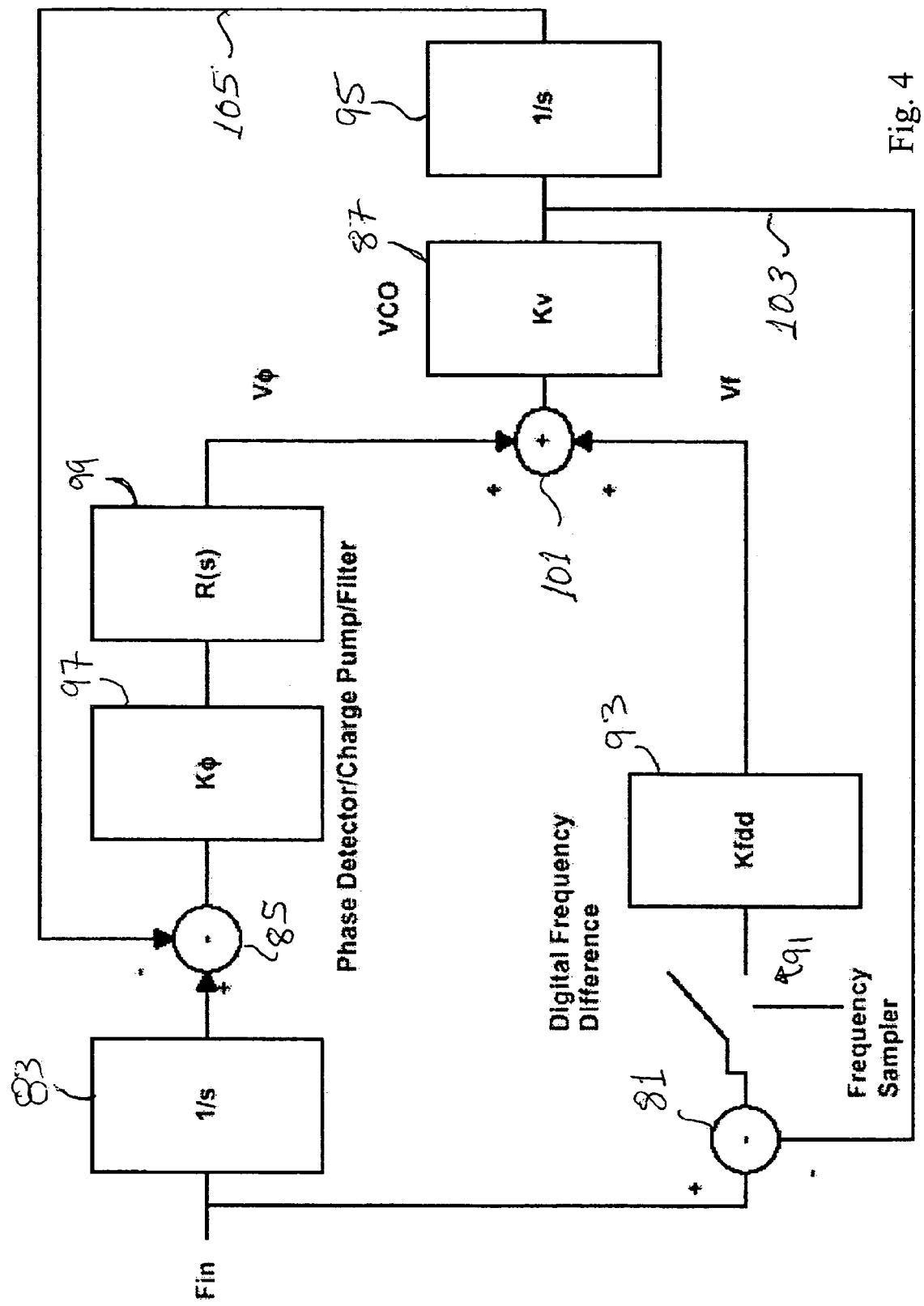
FIG. 4 is a linearized model of a frequency synthesizer in accord with the present invention.

With reference to FIG. 4, a simplified linearized model of the dual loop frequency synthesizer system of the present invention has an input frequency Fin applied to a first input of a frequency difference node 81, and is also converted to relative phase by block 83 that is applied to a first input of a phase difference node 85. The output from a VCO 87 of gain Kv is applied to the second input of frequency difference node 81. The frequency difference is sampled and converted to voltage with gain Kfdd by stages 91 and 93. The output frequency from VCO 87 is converted to a relative phase by block 95 and applied to the second input of phase difference node 85. The phase difference is converted to a voltage with gain KΦ by stage 97, which may comprise the phase detector and charge pump of FIG. 1. The output of stage 97 is filtered with transfer function R(s) at stage 99 and summed at summation node 101 with the frequency difference detector output from stage 93. The output of summation node 101 controls VCO 87.

As shown, the frequency output 103 of VCO 87 closes the digital frequency difference loop and its phase output 105 closes the analog phase detector loop. This simple model may be used on a circuit simulator to investigate the effects of component bandwidths including the VCO modulation bandwidth, filter characteristics, pump currents, etc. Simulations on a Cadence SPECTRE® circuit simulator were used to select the values of components in an experimental test chip. Applying a frequency step input to this model showed that each frequency correction measurement is a time delayed frequency step which causes the analog loop to respond. Improper choice of measurement intervals, filters, and pump current can cause the two corrections to oscillate in opposite directions. However, when the measurement interval for the digital frequency detector, i.e. the frequency sampling interval, is large compared to the bandwidth of the analog phase detection loop, the output Vf of the frequency detector can be regarded as a fixed value while the analog loop responds. The frequency transfer function then becomes the sum of two terms $[sK_vV_f/(s+K\phi R(s))]+[K_vR(s)F_i/(s+K_fR(s))]$, a fixed value contributed by the FDD and a variable term for the analog correction. This implies that the gain KΦR must be kept low in order for the frequency detector loop to dominate.

A chip was built using a 0.18 μm digital logic process to test this proposed frequency synthesizer architecture. Two changes were made to the VCO structure of FIG. 2 to simplify the oscillator design and reduce the size of the required inductor. The first change was the elimination of the tail current source transistor N3. This reduced the frequency of oscillation for a constant sized inductor due to the increased capacitance to ground of the gain transistors. This also increased the noise of the oscillator. However, the increased gain of the cross-coupled inverters over a current limited oscillator allowed operation at a reduced voltage with increased filtering in the supply. The second major change was the use of a 10 bit Digital to Analog Converter (DAC 113 in FIG. 5) and a voltage summing amplifier (115 in FIG. 5) to generate an analog control voltage for the oscillator and eliminate the array of transistor/capacitors Mi/Ci to Mp/Cp (from FIG. 2). This was a pure design choice that allowed a simplified layout of the oscillator for the test chip at the expense of reduced pulling range and increased noise. A diagram of the test chip as built is shown in FIG. 5, including the alternate embodiment of VCO 11.

Figure 5:
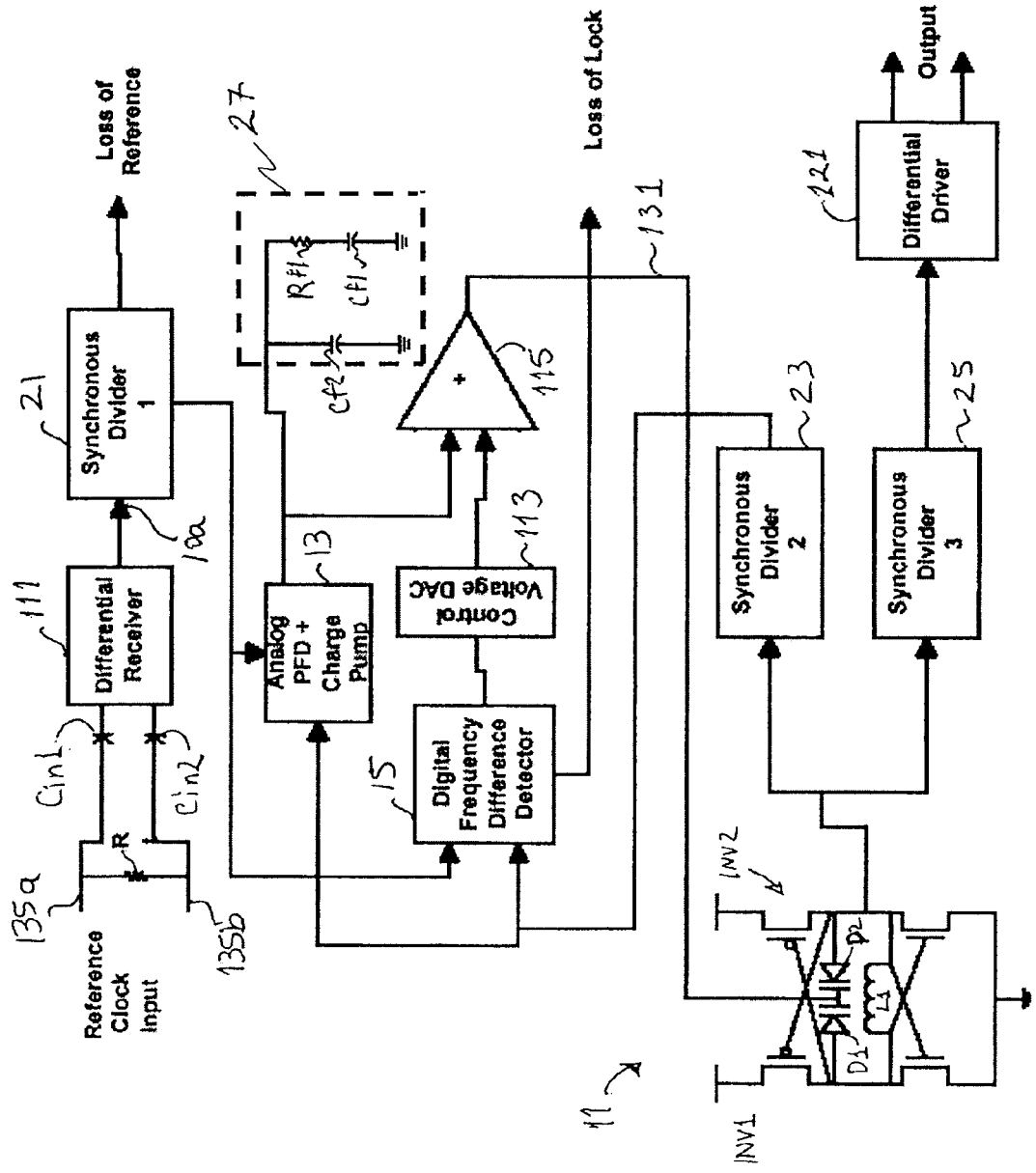
FIG. 5 is a second embodiment of a frequency synthesizer in accord with the present invention.

With reference to FIG. 5, all elements similar to those of FIGS. 1-4 have similar reference characters and are described above. In the presently preferred embodiment, the input reference frequency signal is implemented as an AC coupled LVDS style signal with a 100 ohm R resistor differential termination. As it is known in the art, low voltage difference signals (LVDS) convey information using a differential signaling technique wherein a first signal line 135a carries the true logic of a signal and a second signal line 135b carries its logic complement. In the present case, the differential input signals 135a/135b constituting the reference frequency signal are capacitively coupled to differential receiver 111 by means of two capacitors Cin1 and Cin2. The differential output driver 121 uses a similar drive scheme with a preferred 5 mA current drive.

In the present embodiment, differential receiver 111 converts the differential reference frequency signal of inputs 135a and 135b into a single-ended signal applied to input 10a of frequency divider 21. This is purely a design choice to simplify the comparison of the embodiment of FIG. 5 with that of FIG. 1. It is to be understood that the embodiments of FIGS. 1 and 5 can be used to process a differential input signal without converting it to a single-ended signal by using appropriate differential mode structures for their circuit blocks.

As in the previous case of FIG. 1, the single-ended reference frequency signal of FIG. 5 is applied to optional frequency divider 21 whose output is applied to both analog phase frequency detector 13 (with optional charge pump) and to digital frequency detector 15. Also like in the embodiment of FIG. 1, the output from the analog phase detector 13 subjected to a loop filter 27. However in present case, loop filter 27 on the charge pump output is made external to the chip for ease of construction, and is implemented as a standard second order filter consisting of capacitors Cf1, Cf2, and resistor Rf1. In the present case, the parasitic capacitance of an ESD protection circuit, not sown, was used as the second capacitor in filter 27 with a value of 3 pF.

The three synchronous dividers 21, 23 and 25 were implemented in a shift register style rather than as binary dividers in order to generate specific frequencies. The synchronous dividers 21, 23 and 25 were built in two serial sections, the first capable of producing nominal 50% duty cycle pulses at all integer division ratios between 1 and 8 which feeds the second stage capable of producing all integer division ratios between 1 and 17. In the results reported here the second stage is always set to divide by 1.

As explained above, the output of digital FDD 15 is converted to an analog representation by digital-to-analog converter, DAC 113. The outputs from digital FDD 15 and analog PFD 13 are summed by summer circuit 115, which produces a control signal 131 to adjust the frequency of VCO 11 accordingly.

Also as explained above, VCO 11 is simplified in the present embodiment and consists only of cross-coupled inverters INV1 and INV2, varactor pair D1/D2, and inductor L1.

In the constructed test chip, the oscillator inductor was measured at 3.1 nH. Table I shows some of the characteristics of the experimental chip. The chip was operated at one voltage with a separate input pin for the VCO Vdd. The power was measured while the synthesizer was locked at 1.1 GHz. Note that the summing amplifier passband was only 3 MHz and so represented an upper limit on the open loop response of the analog phase detector loop. The size of the frequency counters determined a measurement interval of 131 μsec, corresponding to a high frequency response of 7.6 kHz for a minimum frequency step.

TABLE I

EXPERIMENTAL CHIP CHARACTERISTICS

| Process | .18 μm digital CMOS | |
|---|---|---|
| Total chip | size 2.8 × 2.8 μm | |
| Vdd | 1.8 V | |
| Power [at 1.1 GHz] | Total | 100.8 mw |
| | VCO | 37 mw |
| | DigitalFDD | 200 μw |
| VCO Frequency | 1.02 GHz min | 1.27 GHz max |
| FDD characteristics | area | .11 mm [272 × 403 μm] |
| | cycle counters | 17 bits |
| | frequency | 10 bits |
| | dead band | 1 LSB |
| Analog PFD/CP | pump current | 50 μa |
| Summing Amplifier | Bandwidth | 3 MHz |

Measurements were taken to determine the effect of operation of both loops simultaneously on lock range and jitter. Lock range for operation with the frequency loop alone was defined to be the region of stable loop operation. This is when the frequency difference detector indicated lock and only a difference corresponding to 1 LSB in the frequency counter was observed. This definition was used since there was no phase coherence with the input. When both loops were operating simultaneously, the region of lock was defined as the frequency range for coherence with the input. Jitter was measured with an Agilent® 86100A, digital communications analyzer, which combines deterministic and random jitter into one measured number.

Examination of the spectrum of the synthesized clock showed a significant number of spurious frequency components due to the switching of the frequency counters and cross products of these frequencies and the reference clock frequency. This was most probably due to the use of a single supply for both analog and digital functions and the relatively poor decoupling of the digital noise. This contributed to the deterministic jitter but could not be separated in the measured number. The low bandwidth of the summing amplifier limited the ability of the analog loop in combined operating mode from reducing this jitter. Nevertheless, the combined loop operation showed a larger lock range, as expected, and a reduction of jitter due to the analog loop.

Table II shows the lock range and jitter as a function of closed loop gain variation caused by changing the feedback divider ratio. The loop filter bandwidth for the analog output was maintained constant at 1.6 MHz as was the pump current for purposes of comparison. The lower value of the frequency in the lock range was always between 1.02 to 1.03 GHz. This shows that operation of both loops together significantly improves the lock range and both RMS and Peak-to-Peak jitter significantly. The low bandwidth of the digital frequency detector coupled with the low gain of the wider bandwidth analog loop should improve the jitter transfer characteristic over a wide band analog only loop.

TABLE II

LOCK RANGE AND JITTER

| | FDD only | | | FDD + Analog PFD | | |
|---|---|---|---|---|---|---|
| Gain | Lock Range MHz | jitter RMS psec | jitter P-P psec | Lock RANGE MHz | jitter RMS psec | jitter P-P psec |
| 1 | 35 | 5.8 | 16 | 6 | 3.8 | 15.6 |
| 2 | 170 | 4.2 | 8.5 | 155 | 2.5 | 6.8 |

TABLE II-continued

LOCK RANGE AND JITTER

| | FDD only | | | FDD + Analog PFD | | |
|---|---|---|---|---|---|---|
| Gain | Lock Range MHz | jitter RMS psec | jitter P-P psec | Lock RANGE MHz | jitter RMS psec | jitter P-P psec |
| 3 | 182 | 4.2 | 8 | 209 | 3.7 | 6.9 |
| 4 | 184 | 4 | 8.2 | 246 | 3.2 | 6.6 |
| 5 | 180 | 3.8 | 21 | 196 | 1.5 | 6.6 |

In the above described test chip, a clock synthesizer using a digital frequency difference detector and an analog phase detector/charge pump operating simultaneously was constructed. The digital frequency difference detector occupies a negligible area and consumes very little power. Due to its all digital nature it offers the possibility of scaling better with lithography than a purely analog design. Even with unoptimized filtering, the test chip showed that the small analog phase detector/charge pump significantly improved the jitter characteristics of the frequency controlled loop without sacrificing any lock range.

The present invention has been described in connection with various preferred embodiments thereof with reference to the accompanying drawings. However, various changes and modifications will be apparent to those skilled in the art based on the foregoing description. Such changes and modifications are intended to be included within the scope of the present invention to the extent they fall within the scope of the appended claims.

What is claimed is:

1. A frequency synthesizer comprising:
an input node for receiving a reference frequency signal;
a variable oscillator having a first control input and a second control input, and producing an oscillator output signal whose frequency is dependent on said first and second control inputs;
an analog voltage phase detector having a first phase-detection input responsive to said reference frequency signal and a second phase-detection input responsive to said oscillator output signal from said variable oscillator, said analog voltage phase detector being effective for producing a first control signal indicative of a phase difference between said reference frequency signal and said oscillator output signal, said first control signal being coupled to said first control input of said variable oscillator, wherein an analog loop is defined by the signal path along said first control signal from said analog voltage phase detector to said variable oscillator and along said oscillator output signal from said variable oscillator back to said analog voltage phase detector;
a digital frequency difference detector having a first frequency-detection input responsive to said reference frequency signal and a second frequency-detection input responsive to said oscillator output signal, said digital frequency difference detector being effective for producing a second control signal indicative of a frequency difference between said reference frequency signal and said oscillator output signal, said second control signal being coupled to said second control input of said variable oscillator, wherein a digital loop is defined by the signal path along said second control signal from said digital frequency difference detector to said variable oscillator and along said oscillator output signal from said variable oscillator back to said digital frequency detector;
wherein the bandwidth of said analog loop is greater than the bandwidth of said digital loop.

2. The frequency synthesizer of claim 1, wherein the bandwidth of said analog loop is at least 200 times greater than the bandwidth of said digital loop.

3. The frequency synthesizer of claim 1, wherein said variable oscillator is a voltage controlled oscillator.

4. The frequency synthesizer of claim 1, further comprising a filter, wherein said first control signal is coupled to said first control input via said filter.

5. The frequency synthesizer of claim 1, further comprising a first frequency divider, wherein:
said input node for receiving said reference frequency signal is coupled to an input of said first frequency divider, and the output of said first frequency divider is coupled to said first phase-detection input of said analog voltage phase detector, whereby the first phase-detection input of said analog voltage phase detector is responsive to said reference frequency signal via said first frequency divider.

6. The frequency synthesizer of claim 5, wherein the output of said first frequency divider is coupled to said first frequency-detection input of said digital frequency difference detector, whereby the first frequency-detection input of said digital frequency difference detector is responsive to said reference frequency signal via said first frequency divider.

7. The frequency synthesizer of claim 1, further comprising a second frequency divider having an input coupled to receive said oscillator output signal from said variable oscillator, and having an output coupled to said second phase-detection input of said analog voltage phase detector, whereby the second phase-detection input of said analog voltage phase detector is responsive to said oscillator output signal via said second frequency divider.

8. The frequency synthesizer of claim 7, wherein the output of said second frequency divider is further coupled to said second frequency-detection input of said digital frequency difference detector, whereby the second frequency-detection input of said digital frequency difference detector is responsive to said oscillator output signal via said second voltage divider.

9. The frequency synthesizer of claim 1, wherein said second control signal from said digital frequency difference detector is coupled to said second control input of said variable oscillator via a digital-to-analog converter that provides said second control input an analog representation of the digital output from said digital frequency difference detector.

10. The frequency synthesizer of claim 9, wherein said variable oscillator includes a summer for summing together the control signals at its first and second control inputs to produce a composite frequency control signal.

11. The frequency synthesizer of claim 1, wherein the variable oscillator's first and second control inputs are independent of each other, and said variable oscillator has at least first and second frequency adjusting mechanisms separately responsive to said first and second control inputs, respectively.

12. The frequency synthesizer of claim 11, wherein said first frequency adjusting mechanism includes a varactor responsive to said first control input, and wherein said second frequency adjusting mechanism includes at least one capacitor conditionally coupled and decoupled from said variable oscillator in response to said second control input.

13. A frequency synthesizer comprising:

an input node for receiving a reference frequency signal;

a variable oscillator responsive to a first control input and to a second control input, and producing an oscillator output signal whose frequency is dependent on said first and second control inputs;

an analog voltage phase detector having a first phase-detection input responsive to said reference frequency signal and a second phase-detection input responsive to said oscillator output signal from said variable oscillator, said analog voltage phase detector being effective for producing a first control signal indicative of a phase difference between said reference frequency signal and said oscillator output signal, said first control signal being coupled to said first control input of said variable oscillator, wherein an analog loop is defined by the signal path along said first control signal from said analog voltage phase detector to said variable oscillator and along said oscillator output signal from logic state and said variable oscillator back to said analog voltage phase detector;

a digital frequency difference detector having a first frequency-detection input responsive to said reference frequency signal and a second frequency-detection input responsive to said oscillator output signal, said digital frequency difference detector being effective for producing a second control signal indicative of a frequency difference between said reference frequency signal and said oscillator output signal, said second control signal being coupled to said second control unput of said variable oscillator, wherein a digital loop is defined by the signal path along said second control signal from said digital frequency difference detector to said variable oscillator and along said oscillator output signal from said variable oscillator back to said digital frequency detector;

wherein said digital frequency difference detector includes:

an n-bit counter for counting pulses received at said first frequency-detection input, whereby said n-bit counter maintains a pulse-count of said reference frequency signal;

an m-bit counter for counting pulses received at said second frequency detection input, whereby said m-bit counter maintains a pulse-count of said oscillation output signal, and wherein m is greater than n;

a first memory cell for storing a SET condition in response to the $n^{th}$ bit within said m-bit counter transitioning into a first logic state and for maintaining said SET condition irrespective of said $n^{th}$ bit within said m-bit counter transitioning out of said first logic state;

a second memory cell for storing a SET condition in response to the $(n+1)^{th}$ bit within said m-bit counter transitioning into said first logic state and for maintaining said SET condition irrespective of said $(n+1)^{th}$ bit transitioning out of said first logic state;

wherein said n-bit counter and said m-bit counter are halted in response to the $n^{th}$ bit within said n-bit counter transitioning into said first logic state; and wherein upon said halting of said n-bit and m-bit counters, said digital frequency difference detector determines:

a) that the output frequency of said variable oscillator is lower than said reference frequency signal when neither of said first or second memory cells have said SET condition stored; or b) that the output frequency of said variable oscillator is higher than said reference frequency signal when said second memory cell has said SET condition stored; or c) that the output frequency of said variable oscillator is higher than said reference frequency signal when said first memory cell has said SET condition stored and any bit within said m-bit counter excluding a predetermined number of least significant bits is set to said first logic state; or d) that the output frequency of said variable oscillator is locked to said reference frequency signal when said first memory cell has said SET condition stored and said second memory cell does not have said SET condition stored and no bit within said m-bit counter excluding said predetermined number of least significant bits is set to said first logic state.

14. The frequency synthesizer of claim 13, wherein said predetermined number of least significant bits is one, whereby upon the halting of said n-bit and m-bit counters, said digital frequency difference detector determines that the output frequency of said variable oscillator is higher than said reference frequency signal when said first memory cell has said SET condition stored and any bit higher than the first bit within said m-bit counter is set to said first logic state.

15. The frequency synthesizer of claim 13, wherein:

said first and second memory cells are first and second latches, respectively;

said first and second latches store said SET condition by being set to, that is latching-in, said SET condition; and said first and second latches may selectively remove said SET condition by being set to a RESET condition.

16. The frequency synthesizer of claim 15, wherein said first and second latches are set to said SET condition by latching-in one of a logic high state and a logic low state, and are set to said RESET condition by latching-in the other of said logic high state and logic low state opposite said SET condition.

17. The frequency synthesizer of claim 15, wherein said digital frequency difference detector further includes a control logic circuit, and wherein:

said first latch is reset in response to said control logic circuit;

said second latch is reset in response to said control logic circuit; and said first and second latches are reset following the determination of whether the output frequency of said variable oscillator is lower than, greater than, or locked to said reference frequency signal.

18. The frequency synthesizer of claim 17, wherein said digital frequency difference detector further includes:

a first masking gate responsive to said control logic circuit and effective for selectively coupling and decoupling said first frequency-detection input to and from said n-bit counter as determined by said control logic circuit, wherein said n-bit counter counts pulses received at said first frequency-detection input when said first masking gate couples said first frequency-detection input to said n-bit counter, and ceases to count pulses received at said first frequency detection input when said first masking gate decoupled said first frequency-detection input from said n-bit counter whereby said n-bit counter is halted; and a second masking gate responsive to said control logic circuit and effective for selectively coupling and decoupling said second frequency-detection input to and from said m-bit counter as determined by said control logic circuit, wherein said m-bit counter counts pulses received at said second frequency-detection input when said second masking gate couples said second frequency-detection input to said m-bit counter, and ceases to count pulses received at said second frequency detection input when said second masking gate decoupled said second frequency-detection input from said m-bit counter whereby said m-bit counter is halted.

19. The frequency synthesizer of claim 17, wherein said digital frequency difference detector further includes an up/down counter, and said control logic circuit instructs said up/down counter to:

make a count step change in one of an up or down direction when the output frequency of said variable oscillator is determined to be higher than said reference frequency signal, make a count step change in the other of said up or down direction when the output frequency of said variable oscillator is determined to be lower than said reference frequency signal, or remain unchanged when the output frequency of said variable oscillator is determined to be locked to said reference frequency signal;

wherein the output of said up/down counter is coupled to said variable oscillator.

20. The frequency synthesizer of claim 19, wherein:

the output frequency of said variable oscillator is dependent on the enabling or disabling of multiple capacitors and each of said multiple capacitors is enabled and disabled in response to a respective cap_control input, and said up/down counter places its current count value on an output bus, said output bus constituting said second control signal, wherein separate bits in said output bus are coupled to separate cap_control inputs to modify the frequency of said variable oscillator.

21. The frequency synthesizer of claim 19, wherein:

the output frequency of said variable oscillator is dependent on the signal strength of a frequency-adjust-input coupled to receive said second control signal;

the output of said up/down counter is applied to a digital-to-analog converter to produce said second control signal.

22. The frequency synthesizer of claim 19, wherein:

said digital frequency difference detector provides an inherent low pass filter for filtering the frequency difference between the reference frequency signal and the oscillator output signal from said variable oscillator; and the bandwidth of said inherent low pass filter is adjustable by increasing or decreasing the value of n in said n-bit counter and adjusting the increment/decrement step size of said up/down counter.

\* \* \* \* \*

UNITED STATES PATENT AND TRADEMARK OFFICE
CERTIFICATE OF CORRECTION

| | | |
|---|---|---|
| PATENT NO. | : 7,349,514 B2 | Page 1 of 1 |
| APPLICATION NO. | : 10/796331 | |
| DATED | : March 25, 2008 | |
| INVENTOR(S) | : David Meltzer et al. | |

It is certified that error appears in the above-identified patent and that said Letters Patent is hereby corrected as shown below:

Column 13
Lines 22 and 23, please change "from logic state and said variable" to --from said variable--.

Signed and Sealed this

Seventeenth Day of March, 2009

JOHN DOLL
*Acting Director of the United States Patent and Trademark Office*